US007087142B2

(12) United States Patent
Wickersham, Jr. et al.

(10) Patent No.: US 7,087,142 B2
(45) Date of Patent: Aug. 8, 2006

(54) METHOD FOR DETERMINING A CRITICAL SIZE OF AN INCLUSION IN ALUMINUM OR ALUMINUM ALLOY SPUTTERING TARGET

(75) Inventors: Charles E. Wickersham, Jr., Columbus, OH (US); John E. Poole, Grove City, OH (US); Alexander Leybovich, Hilliard, OH (US); Lin Zhu, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 188 days.

(21) Appl. No.: 10/473,844

(22) PCT Filed: Apr. 4, 2002

(86) PCT No.: PCT/US02/10516

§ 371 (c)(1),
(2), (4) Date: Sep. 30, 2003

(87) PCT Pub. No.: WO02/081767

PCT Pub. Date: Oct. 17, 2002

(65) Prior Publication Data

US 2004/0118675 A1     Jun. 24, 2004

Related U.S. Application Data

(60) Provisional application No. 60/281,482, filed on Apr. 4, 2001.

(51) Int. Cl.
*C25C 14/34* (2006.01)
(52) U.S. Cl. .............................. 204/192.12; 204/192.13; 204/192.15; 204/298.03; 204/298.12; 204/298.13
(58) Field of Classification Search ........... 204/192.12, 204/192.13, 192.15, 192.17, 298.03, 298.12, 204/298.13
See application file for complete search history.

(56) References Cited

U.S. PATENT DOCUMENTS 2,790,216 A     4/1957 Hunter (Continued)

FOREIGN PATENT DOCUMENTS

EP     0 211 401 B1     5/1992

(Continued)

OTHER PUBLICATIONS

Freitag, W.O. et al., "Diode Sputtering of Cermets Films," *2nd Symposium on Deposition of Thin Films by Sputtering*, University of Rochester and Consolidated Vacuum Corporation, Rochester, NY, Jun. 1967, pp. 92-96.

(Continued)

*Primary Examiner*—Rodney G. McDonald
(74) *Attorney, Agent, or Firm*—Wegman, Hessler & Vanderburg

(57) ABSTRACT

The present invention relates to a method for determining a critical size for a diameter of an $Al_2O_3$ inclusion (38) in an Al or Al alloy sputter target (42) to prevent arcing during sputtering thereof. This method includes providing a sputtering apparatus having an argon plasma. The plasma has a plasma sheath of a known thickness during sputtering under a selected sputtering environment of an Al or Al alloy sputter target having an $Al_2O_3$ inclusion-free sputtering surface. When the thickness of the sheath is known for a selected sputtering environment, the critical size of an $Al_2O_3$ inclusion (38) can be determined based upon the thickness of the sheath. More specifically, the diameter of an $Al_2O_3$ inclusion (38) in an Al or Al alloy sputter target (42) must be less than the thickness of the plasma sheath during sputtering under the selected sputtering environment to inhibit arcing.

22 Claims, 10 Drawing Sheets

U.S. PATENT DOCUMENTS

| | | | |
|---|---|---|---|
| 4,054,173 | A | 10/1977 | Hickam |
| 4,474,225 | A | 10/1984 | Yu |
| 4,568,007 | A | 2/1986 | Fishler |
| 4,740,481 | A | 4/1988 | Wilson et al. |
| 4,797,164 | A | 1/1989 | Höllrigl et al. |
| 5,160,388 | A | 11/1992 | Legresy et al. |
| 5,369,063 | A | 11/1994 | Gee et al. |
| 5,406,850 | A | 4/1995 | Bouchard et al. |
| 5,559,614 | A | 9/1996 | Urbish et al. |
| 5,636,681 | A | 6/1997 | Sulzer et al. |
| 5,651,865 | A | 7/1997 | Sellers |
| 5,738,767 | A | 4/1998 | Coad et al. |
| 5,804,730 | A | 9/1998 | Pfannenstiel et al. |
| 5,827,409 | A | 10/1998 | Iwata et al. |
| 5,887,481 | A | 3/1999 | Leroy et al. |
| 5,943,559 | A | 8/1999 | Maeda |
| 5,955,673 | A | 9/1999 | Leroy et al. |
| 5,989,782 | A | 11/1999 | Nishiki et al. |
| 6,001,227 | A | 12/1999 | Pavate et al. |
| 6,017,779 | A | 1/2000 | Miyasaka |
| 6,019,657 | A | 2/2000 | Chakvorty et al. |
| 6,020,946 | A | 2/2000 | Callegari et al. |
| 6,057,557 | A | 5/2000 | Ichikawa |
| 6,074,455 | A | 6/2000 | van Linden et al. |
| 6,139,701 | A | 10/2000 | Pavate et al. |
| 6,269,699 | B1 | 8/2001 | Gilman et al. |
| 6,439,054 | B1 | 8/2002 | Gore et al. |
| 6,487,910 | B1 | 12/2002 | Leybovich |
| 2002/0184970 | A1 | 12/2002 | Wickersham, Jr. et al. |

FOREIGN PATENT DOCUMENTS

| | | |
|---|---|---|
| EP | 0 418 846 B1 | 2/1995 |
| EP | 0 665 193 B1 | 8/1995 |
| EP | 0 467 659 B1 | 3/1996 |
| EP | 0 412 843 B1 | 5/1996 |
| EP | 0 561 161 B1 | 4/1997 |
| FR | 2 744 805 | 8/1997 |
| WO | WO 97/30348 | 8/1997 |
| WO | WO 99/64854 | 12/1999 |
| WO | WO 00/15863 | 3/2000 |
| WO | WO 01/79569 A1 | 10/2001 |
| WO | WO 01/86282 A1 | 11/2001 |
| WO | WO 03/014718 A2 | 2/2003 |

OTHER PUBLICATIONS

Robinson, J.E. et al., "Models for Chunk Sputtering," *Journal of Nuclear Materials*, 1976, vol. 63, pp. 432-437, North-Holland Publishing Company.

Eernisse, E.P. et al., "Role of Integrated Lateral Stress in Surface Deformation of He-Implanted Surfaces," *Journal of Applied Physics*, Jan. 1, 1977, vol. 48, No. 1, pp. 9-17, American Institute of Physics.

Roth, R.M. et al., "Spatial Dependence of Particle Light Scattering in an RF Silane Discharge," *Appl. Phys. Letter*, Feb. 1, 1985, vol. 46, No. 3, pp. 253-255, American Institute of Physics.

Wehner, G.K., "Cone Formation as a Result of Whisker Growth on Ion Bombarded Metal Surfaces," *J. Vac. Sci. Techol.*, Jul./Aug. 1985, A 3 (4), pp. 1821-1835, American Vacuum Society.

Spears, K.G. et al., "Particle Distributions and Laser-Particle Interactions in an RF Discharge of Silane," *IEEE Transactions on Plasma Science*, Apr. 1986, vol. PS-14, No. 2, pp. 179-187, IEEE.

Selwyn, G.S. et al., "*In Situ* Laser Diagnostic Studies of Plasma-Generated Particulate Contamination," *J. Vac. Sci. Technol.*, Jul./Aug. 1989, A 7, (4) pp. 2758-2765, American Vacuum Society.

Anderson, H.M. et al., "Particulate Generation in Silane / Ammonia RF Discharges," *J. Applied Physics*, May 1, 1990, vol. 67, No. 9, pp. 3999-4011, American Institute of Physics.

Jellum, G.M. et al, "Particulates in Aluminum Sputtering Discharges," *J. Appl. Phys.*, May 15, 1990, vol. 67 No. 10, pp. 6490-6496, American Institute of Physics.

Selwyn, G.S. et al., "*In situ* Plasma Contamination Measurements by HeNe Laser Light Scattering: A Case Study," *J. Vac. Sci. Techol.*, May / Jun. 1990, A 8, (3) pp. 1726-1731, American Vacuum Society.

Selwyn, G.S. et al., "Particle Trapping Phenomena in Radio Frequency Plasmas," *Appl. Phys. Letter*, Oct. 29, 1990, vol. 57, No. 18 pp. 1876-1878, American Institute of Physics.

Akari, K. et al., "Reduction in Macroparticles During the Deposition of TiN Films Prepared by Arc Ion Plating," *Surface and Coatings Technology*, 1990, 43/44, pp. 312-323, Elsevier Sequoia, The Netherlands.

Barnes, M.S. et al., "Transport of Dust Particles in Glow-Discharge Plasmas," *Physical Review Letters*, Jan. 20, 1992, vol. 68, No. 3, pp. 313-316, The American Physical Society.

Smadi, M.M. et al., "Particle Contamination on a Silicon Substrate in a $SF_6$/ Ar Plasma," *J. Vac. Sci. Techol.*, Jan./Feb. 1992, B 10, (1) pp. 30-36, American Vacuum Society.

Yoo, W.J. et al., "Kinetics of Particle Generation in Sputtering and Reactive Ion Etching Plasmas," *Appl. Phys. Letter*, Mar. 2, 1992, vol. 60, No. 9, pp. 1073-1075, American Institute of Physics.

Logan, J.S. et al., "Study of Particle Emission in Vacuum from Film Deposits," *J. Vac. Sci. Techol.*, Jul./Aug. 1992, A 10, (4) pp. 1875-1878, American Vacuum Society.

Goree J. et al., "Particulate Release from Surfaces Exposed to a Plasma," *J. Vac. Sci. Techol.*, Nov./Dec. 1992, A 10, (6) pp. 3540-3544, American Vacuum Society.

Von Güntherschulze, A., "Die Electronengeschwindigkeit in Isolatoren bei hohen Feldstärken und ihre Beziehung zur Theorie des elektrischen Durchschlages," *Z. Physik*, Oct. 25, 1933, 86, pp. 778-786, Mitteilung aus dem Institut für Allgemeine Elektrotechnik der Technischen Hochschule, Dresden, Germany.

Foster, H.I. et al., "A Modular Approach to Sputter Coating of Flat Panel Displays," *Society of Vacuum Coaters 35th Annual Technical Conference*, 1992, pp. 357-361.

Danovich, D. et al., "Sputtering Issues for Flat-Panel Displays," *Information Display*, Nov. 1995, pp. 26-27, 30-31.

Anderson, L., "A New Technique for Arc Control in DC Sputtering," *Society of Vacuum Coaters 35th Annual Technical Conference Proceedings*, 1992, pp. 325-329.

Nadel, S.J. et al., "Enhanced Chromium First Surface Mirrors," *Society of Vacuum Coaters, 35th Annual Technical Conference Proceedings*, 1992, pp. 365-369.

Scholl, R.A., "A New Method of Handling Arcs and Reducing Particulates in DC Plasma Processing," *Society of Vacuum Coaters 37th Annual Technical Conference Proceedings*, 1994, pp. 312-315, Advanced Energy Industries, Inc.

Lee, F. et al., "Detecting and Reducing Particles for LPCVD Silicon Nitride Deposition," *Microcontamination*, Mar. 1994, vol. 12, pp. 33-37, 76-77.

Bailey, R.S. et al., "Particle Emission from $Al_2O_3$ Doped Aluminum Targets During Sputtering Deposition," *VMIC Conference, ISMIC*, Jun. 7-8, 1994, p. 317.

Takahashi, K.M. et al., "Current Capabilities and Limitations of *In Situ* Particle Monitors in Silicon Processing Equipment," *J. Vac. Sci. Techol.*, Nov./Dec. 1996, A 14, (6) pp. 2983-2993, American Vacuum Society.

Selwyn, G.S. et al., "Particle Contamination Formation in Magnetron Sputtering Processes," *J. Vac. Sci. Technol*, Jul./Aug. 1997, A 15 (4), pp. 2023-2028, American Vacuum Society.

Monteiro, O.R. et al., "Vacuum-Arc-Generated Macroparticles in the Nanometer Range," *IEEE Transactions on Plasma Science*, Aug. 1999, vol. 27, No. 4, pp. 1030-1033, IEEE.

Abburi, M. et al., "Low-Defect Target Metallurgy Development for sub-0.18 μm Al-based Interconnects," *Solid State Technology*, Dec. 1999, vol. 42, pp. 55-58, Solid State Technology.

Wickersham, Jr., C.E., et al., "Arc Generation from Sputtering Plasma Di-electric Inclusion Interactions," *J. Vac. Sci. Technology*, May/Jun. 2002, A20 (3) pp. 833-838, American Vacuum Society.

Leybovich, A. et al., "Effect of Thin Film Oxide Inclusions on Aluminum Target Arcing and Particulate," *AVS 42$^{nd}$ Natl. Symposium*, Oct. 16-22, 1995, Minneapolis, MN.

Tian, X. et al., "Modeling of the Relationship Between Implantation Parameters and Implantation Dose During Plasma Immersion Ion Implantation," *Physic Letters A*, 227 (2000), pp. 42-46, Department of Physics and Materials Science, City University of Hong Kong, 2000.

*NERAC.COM list*, Jul. 6, 2000.

*Flex SCAN-C Ultrasonic C-Scan Users Guide*, Sonix, Inc., Version 4, Jun. 1998, pp. 3-9, 3-10, Springfield, MO.

"Bonded Particle Filter Systems," Metaullic Systems Co., L.P., pp. 1-2, 1993, 2000.

"Bonded Particle Filter Media Applications" http://www.metaullics.com/filters_details.html, pp. 1-2, 1993, 2000.

Friedrichs et al., "Measurement of Viscosity, Density and Surface Tension of Metal Melts," *Steel Research*, vol. 68, No. 5, pp. 209-214, Aichen, Germany, (Abstract only).

Nizhenko, V.I. et al., "Surface Tension of Melts of the System Aluminum-Silicon," *Adgezia Pacplavov I Paika Materialov*, 1992, 27, pp. 37-40, Academy of Sciences, Ukraine (Abstract only).

Pavate, V. et al., "Correlation Between Aluminum Alloy Sputtering Target Metallurgical Characteristics, Arc Initiation, and In-Film Defect Intensity," *SPIE*, Sep. 1997, vol. 3214, pp. 42-47, (Abstract only).

Wickersham, Jr., C.E. et al., "Sputtering Process Induced Molten Metal Defects In Aluminum Alloy Metallization," *Semicon China 2000 Technical Symposium*, Session 1—Process Technology, Shanghai, China, C-1, 2000.

Pfeill, P.C.L. et al., "The Effect of Inclusions on the Arcing Behaviour of Metals," *Journal of Nuclear Materials*, 1959, vol. 3, pp. 244-248, North Holland Publishing Co., Amsterdam.

Hancox, R. et al., "Importance of Insulating Inclusions in Arc Initiation," *British Journal of Applied Physics*, Oct. 1960, vol. 11, pp. 468-471.

Maskrey, J.T. et al., "The Role of Inclusions and Surface Contamination Arc Initiation at Low Presures," *British Journal of Applied Physics*, 1966, vol. 17, pp. 1025-1035.

Druyvesteyn, M.J., "Electron Emission of the Cathode of an Arc," *Nature*, Apr. 4, 1936, vol. 137, p. 580.

Bailey, R.S. et al., "Particle Emission From Doped Targets, During Sputter Deposition of Aluminum Alloy Thin Films," *VMIC Conference Proceedings, ISMIC*, 1994, p. 317.

Keegan, N.J., et al., *Light Metals* 1999, pp. 1031-1040, (Abstract only).

Dugdale, R.A. et al., "Arc Initiation on Heated Molybdenum Exposed to a Toroidal Hydrogen Discharge," *Journal of Nuclear Materials*, vol. 6, No. 1, pp. 35-45, 1962.

Maskrey, J.T. et al., "The Importance of Contamination in Arc Initiation on Stainless Steel Exposed to a Toroidal Discharge," *Journal of Nuclear Materials*, 1963, 10, pp. 233-242, North Holland Publishing Co., Amsterdam.

Leybovich, A. et al., "Effects on Target Polycrystalline Structure and Surface Gas Coverage on Magentron I-V Characteristics," *J. Vac. Sci. Technol.*, Jul./Aug. 1994, A 12, 1618-1622, American Vacuum Society.

Achtert, J. et al., "Influence of Surface Contaminations on Cathode Processes of Vacuum Discharges," *Beitr. Plasmaphys.*, 1977, 17, pp. 419-431.

Aksensov, I.I. et al., "Droplet Phase of Cathode Erosion in a Steady Vacuum Arc," *Sov. Phys. Tech Phys.*, Aug. 1984, vol. 29, No. 8, pp. 893-894, American Institute of Physics.

Proskyrovskiy, D.I. et al., "On the Drop Fraction of Cathode Erosion During Explosive Electron Emission," *Sov. Phys.-Tech. Phys.*, 1979, 24, pp. 99-103.

Compton, K.T., "An Interpretation of Pressure and High Velocity Vapor Jets at Cathodes of Vacuum Arcs," *Physical Review*, Aug. 15, 1930, vol. 36, pp. 706-708.

McClure, G.W., *Journal of Applied Physics*, May 1974, vol. 45, Issue 5, pp. 2078-2084, (Abstract only).

Hantzsche, E. et al., "Erosion of Metal Cathodes by Arcs and Breakdowns in Vacuum," *J. Phys. D Appl. Phys.*, 1976, vol. 9, pp. 1771-1783, Great Britain.

Wickersham, Jr., C.E. et al., "Measurements of the Critical Inclusion Size for Arcing and Macroparticle Ejection from Aluminum Sputtering Targets," *J. Vac. Sci. Technol.*, Nov./Dec. 2001, A 19 (6), pp. 2767-2772, American Vacuum Society 2001.

Augis, J.E. et al., "Scanning Electron Microscope Study of Electrode Damage Due to Nanosecond Arcs," *Journal of Applied Physics*, Aug. 1971, vol. 42, Issue 9, pp. 3367-3368, (Abstract only).

METHOD FOR DETERMINING A CRITICAL SIZE OF AN INCLUSION IN ALUMINUM OR ALUMINUM ALLOY SPUTTERING TARGET

CROSS-REFERENCE TO RELATED INVENTION

Priority filing benefit of (1) International PCT application PCT/US02/10516 filed Apr. 4, 2002, and published under PCT 21(2) in the English language and (2) U.S. Provisional Application Ser. No. 60/281,482 filed Apr. 4, 2001.

FIELD OF THE INVENTION

The present invention relates generally to aluminum or aluminum alloy sputter targets having aluminum oxide ($Al_2O_3$) inclusions and, more particularly, to a method for determining a critical size of an $Al_2O_3$ inclusion in an aluminum or aluminum alloy sputter target to inhibit bipolar arcing during sputtering thereof.

BACKGROUND OF THE INVENTION

The presence of an $Al_2O_3$ inclusion in an Al or Al alloy sputter target can result in arcing when the target is sputtered in a sputtering apparatus. During sputtering, an electric field forms in the sputtering apparatus between the target and an anode. This electric field ionizes a gas, such as argon, within the sputtering apparatus so as to form a plasma. Typically, a plasma sheath, or dark space, separates a positive column of the plasma from the sputter target. This sheath has a certain thickness. Introduction of an $Al_2O_3$ inclusion on the surface of the target can distort the electric field so as to alter the shapes of the positive plasma column and the plasma sheath.

Over time, electrical charges can build up in the vicinity of an $Al_2O_3$ inclusion. When the electrical charge imbalance becomes sufficiently strong, a high current density cathodic arc forms. The high current density cathodic arc heats a small section of the target surface, often sufficiently to melt the target material in that section. The arc pressure causes droplets of liquid metal to eject from the sputtering target surface at high velocity and strike an intended substrate, such as a silicon chip. The droplets, or macroparticles, solidify on the substrate creating large defects thereon. These macroparticles can range in size from less than 1 µm to greater than 50 µm in diameter and can reduce significantly device yields, for example, in integrated circuit manufacturing.

Dielectric inclusions and surface layers have long been known to cause arcing in plasma discharges as well as in vacuum spark gaps. More recently, research on arcing in sputtering plasmas has shown that inclusion and surface oxide induced arcing causes molten metal macroparticle ejection from aluminum sputtering targets producing particle defects on the substrate. High-speed video analysis of arcing from heavily doped aluminum-aluminum oxide sputtering targets has shown that the molten metal macroparticles ejected therefrom can have speeds of over 500 m/sec and temperatures of 3000 K.

It has been reported that dielectric inclusions between 0.10 and 10 µm cause arc initiation in a hydrogen plasma with 0.1 $mA/cm^2$ discharge current; hydrogen pressures between 2.7 and 13 Pa; and a cathode bias between 100 and 500 volts. Also, arcing from aluminum targets sputtered in $10^{14}$ $ions/cm^3$ argon, hydrogen and nitrogen plasmas with 1-µm diameter $Al_2O_3$ inclusions on the cathode surface has been reported. Finally, evidence for a critical size effect for arc initiation from inclusions in hydrogen tokomak plasmas has been reported but critical inclusion sizes were not measured.

Notably, attempts have been made to reproduce the above results where inclusion sizes were measured. As a result, it was determined that the arcs were a result of surface contamination and not the size of the inclusions. Apparently, the small values for the critical size of the inclusion for arc initiation that initially were reported appeared to be due to surface contamination effects. As such, it is important to provide contaminant-free sputter targets when examining the effect of inclusion sizes on arc initiation.

Consequently, there remains a need in the art for methods to inhibit bipolar arcing in Al or Al alloy sputter targets having $Al_2O_3$ inclusions. Such methods are calculated to improve device yields and decrease scrap, thereby reducing manufacturing costs in fields such as the manufacture of integrated circuits.

SUMMARY OF THE INVENTION

The present invention provides a method for determining a critical size for an $Al_2O_3$ inclusion in an Al or Al alloy sputter target to prevent arcing during sputtering thereof.

This method includes providing a sputtering apparatus having a plasma column, such as argon. The plasma has a plasma sheath of a known thickness during sputtering under a selected sputtering environment of an Al or Al alloy sputter target having an $Al_2O_3$ inclusion-free sputtering surface. If the thickness of the sheath is unknown, it preferably is measured by providing an Al or Al alloy sputter target having an $Al_2O_3$ inclusion-free sputtering surface for sputtering under a selected sputtering environment in the sputtering apparatus. The sheath thickness can then be calculated using the Child-Langmuir law by factoring in the known conditions for the selected sputtering environment including the sputtering voltage, ion mass and ion current density.

When the thickness of the sheath is known, or measured, for a selected sputtering environment, the critical size of an $Al_2O_3$ inclusion can be determined based upon the thickness of the sheath. More specifically, the diameter, or effective diameter, of an $Al_2O_3$ inclusion in an Al or Al alloy sputter target must be less than the thickness of the plasma sheath during sputtering under the selected sputtering environment to inhibit arcing. Once the critical size is determined for the $Al_2O_3$ inclusion, an Al or Al alloy sputter target having an $Al_2O_3$ inclusion of a known diameter that is less than the thickness of the plasma sheath can be provided for sputtering in the sputtering apparatus under the selected sputtering environment so that bipolar arcing of the Al or Al alloy sputter target is inhibited. Since sputtering of the sputter target is performed at the sputtering surface, it is preferred that the measurement of the diameter of the $Al_2O_3$ inclusion be taken in a plane substantially parallel with the sputtering surface.

Being able to determine the critical size of an $Al_2O_3$ inclusion in Al or Al alloy sputter target, will allow device yields, for example, in integrated circuit manufacturing, to increase and will allow scrapped products to be reduced resulting in a monetary savings for all involved.

Accordingly, one object of the present invention is to determine the critical size for an $Al_2O_3$ inclusion in an aluminum or aluminum alloy sputter target sputtered under plasma in a sputtering apparatus.

Another object of the invention is to prevent arcing during sputtering of an Al or Al alloy sputter target having an $Al_2O_3$ inclusion.

Yet, another object of the invention is to understand how the inclusion or surface oxide size affects the propensity of the sputtering plasma to arc, as well as to find the relationship between inclusion size, sputtering power, and the propensity for arcing and molten macroparticle ejection.

Other objects and advantages of the invention will be apparent from the following description, the accompanying drawings and the appended claims.

DETAILED DESCRIPTION OF THE PREFERRED EMBODIMENT

Figure 1:
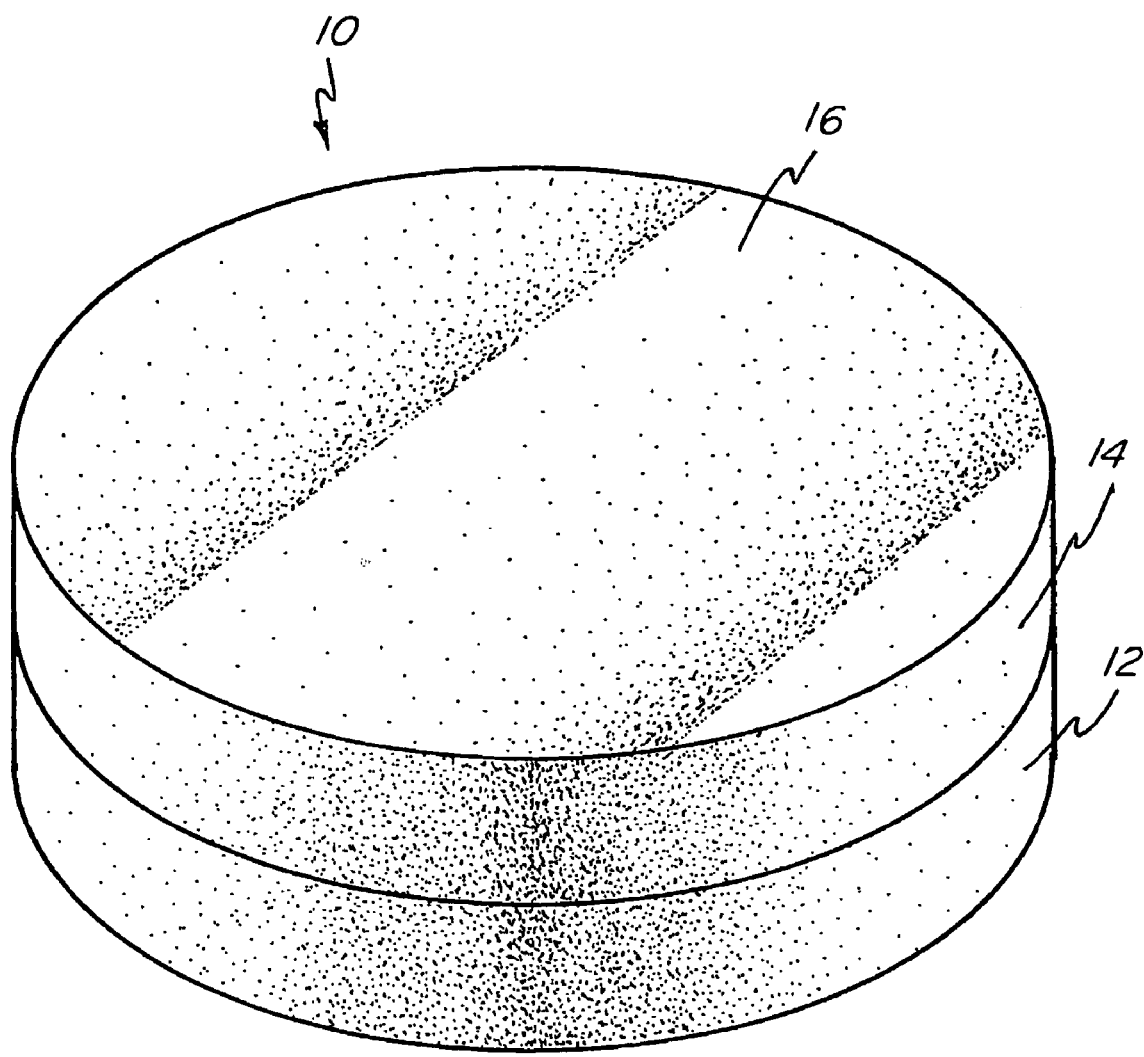
FIG. 1 is a perspective view of a conventional sputter target assembly having a backing plate and a target.

We have discovered unexpectedly that there is a critical size for an $Al_2O_3$ inclusion for initiating arcing and molten macroparticle emission during sputtering of Al or Al alloy sputter targets in a plasma in a sputtering apparatus. As shown in FIG. 1, a sputter target assembly 10 preferably includes a backing plate 12 and a target 14 bonded together wherein the target 14 and backing plate 12 both are made of Al or Al alloys. The target 14 includes a sputtering surface 16 for sputtering in a sputtering apparatus (not shown) and preferably comprises a high grade Al or Al alloy. Preferred Al alloys for use in the target 14 and the backing plate 12 include Al—Cu alloys. An intermediate layer (not shown) may be provided between the target and backing plate.

Any conventionally available sputtering apparatus used for sputtering targets in a plasma, preferably an argon plasma, can be used. The plasmas in these conventional apparatuses form a plasma sheath having a known, or measurable, thickness under a selected sputtering environment. If the thickness of the sheath is unknown, it is preferably measured by providing a contaminant-free Al or Al alloy sputter target having an $Al_2O_3$ inclusion-free sputtering surface for sputtering under a selected sputtering environment in the sputtering apparatus. The sheath thickness can then be estimated using the Child-Langmuir law by factoring in the known conditions for the selected sputtering environment including the sputtering voltage, ion mass, and ion current density among others. More specifically, sheath thickness, s in MKS units becomes $s=4.7\times10^{-11} V^{3/4}/(M_i \cdot J_i)^{1/4}$ with V representing the sputtering voltage; $M_i$, the ion mass; and $J_i$, the ion current density.

When the thickness of the sheath is known, or measured, for a selected sputtering environment, the critical size of an $Al_2O_3$ inclusion can be determined based upon the thickness of the sheath. More specifically, the diameter, or minimum effective diameter, of an $Al_2O_3$ inclusion in an Al or Al alloy sputter target must be less than the thickness of the plasma sheath during sputtering under the selected sputtering environment to inhibit arcing. While some inclusions may be substantially circular in nature such that a diameter measurement easily can be realized, it is understood that a minimum effective diameter can be realized for $Al_2O_3$ inclusions having somewhat irregular or non-circular shapes. Accordingly, diameter shall be used interchangeably with minimum effective diameter. It is this measured diameter that is compared with the measured thickness of the plasma sheath. Additionally, since sputtering of the sputter target is performed at the sputtering surface, it is preferred that the measurement of the diameter of an $Al_2O_3$ inclusion be taken along a plane substantially parallel with the sputtering surface.

$Al_2O_3$ inclusions that are located on the sputtering surface of an Al or Al alloy sputter target can be measured rather simplistically such as via scanning electron microscopy, or any other suitable measuring device or means. In contrast, the inclusions provided within the sputter target, and not on the surface, must be measured by other more involved methods such as via an ultrasonic scanning method like the one disclosed in U.S. Pat. No. 5,406,850 hereby incorporated by reference herein. Additional measuring methods which may be suitable can be found in U.S. Provisional patent application Ser. No. 09/700,268 filed Nov. 9, 2000 titled "Method and Apparatus for Quantitative Sputter Target Cleanliness and Characterization, U.S. Provisional Patent Application Ser. No. 60/197,790 filed Apr. 14, 2000 titled "Macroparticle Free Metallic Sputtering Targets," U.S. Provisional Patent Application Ser. No. 60/311,152 filed Aug. 9, 2001 titled "Method and Apparatus for Non-Destructive Target Cleanliness and Characterization by Types of Flaws Sorted by Size and Location" and International Application Number PCT/US01/14403 filed May 4, 2001 titled "Cleanliness Evaluation in Sputter Targets using Phase" all of which are hereby incorporated by reference herein.

When an $Al_2O_3$ inclusion has a diameter less than the sheath thickness, arcing behavior is inhibited when the inclusion is exposed to the sputtering plasma. When the inclusion has a diameter that is substantially equal to or greater than the plasma sheath, then bipolar arcing will occur causing significant arcing activity during sputtering with ejection of molten metal macroparticles from the interaction of the charged dielectric inclusion surface with the sputtering plasma. As such, if the $Al_2O_3$ inclusions in the Al or Al alloy sputter target are too large in diameter, the target is rejected.

Once the critical size is determined for the $Al_2O_3$ inclusion, a contaminate-free Al or Al alloy sputter target can be provided having no $Al_2O_3$ inclusions with diameters greater than the measured thickness of the plasma sheath for sputtering in the sputtering apparatus under the selected sputtering environment. Finally, the sputter target can be sputtered in the sputtering apparatus under the selected sputtering environment, whereby arcing is inhibited.

EXAMPLE

The following example is provided for illustrative purposes only.

I. Experimental Procedures

To understand how the size of the $Al_2O_3$ inclusion in an Al or Al alloy sputter target affects the propensity for the plasma in a sputtering apparatus to breakdown into an arc during sputtering, the following sputtering experiments were conducted in a cryopumped vacuum chamber using a 7.6 cm diameter aluminum sputtering target. The thickness of the plasma sheath in this study was controlled and determined to be between 300 and 600 μm during sputtering of the aluminum target under a selected sputtering environment as discussed below.

To begin, small holes were drilled into the face of sputtering targets and small (0.01 to 3 mm) $Al_2O_3$ inclusions were placed into the holes using tweezers. For purposes of the experiments herein, only $Al_2O_3$ inclusions having an aspect ratio of about 1 were tested.

The softness of the aluminum and hardness of the $Al_2O_3$ inclusions allowed the inclusions to remain mechanically locked in the sputtering surfaces of the aluminum targets. The inclusion particles were always placed in the centers of the magneton erosion or sputter tracks on the targets where sputtering occurred with more frequency.

Figure 2:
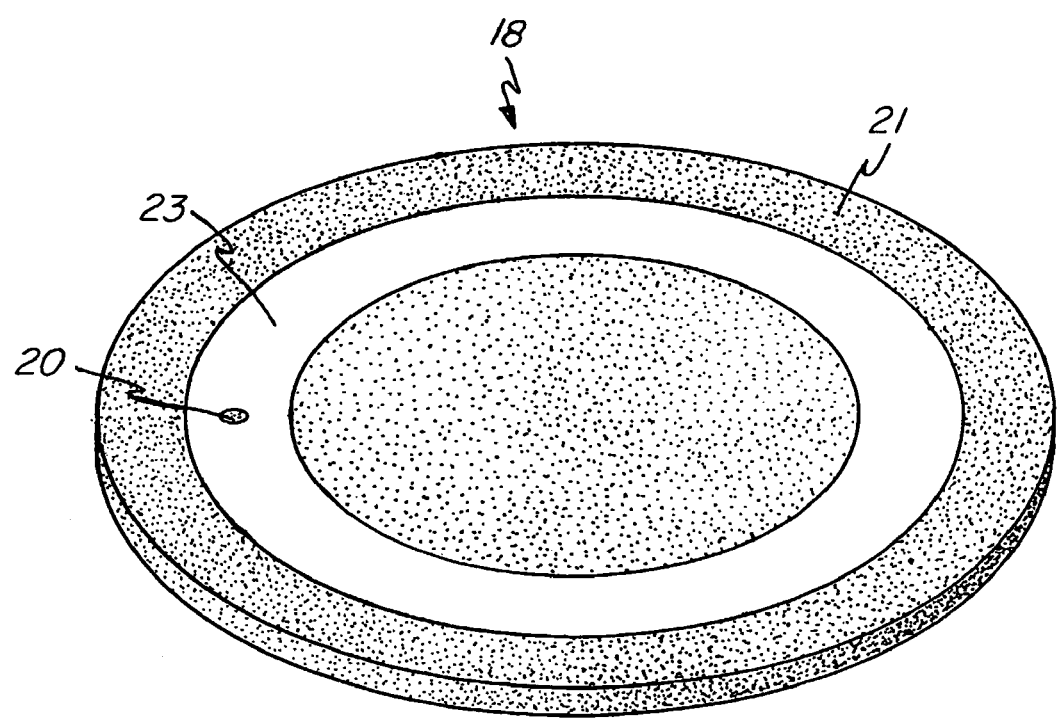
FIG. 2 is a schematic perspective view of an aluminum target having a sputter track provided with an aluminum oxide inclusion.

FIG. 2 shows a schematic diagram of the experimental arrangement where an aluminum target plate 18 has an embedded $Al_2O_3$ inclusion 20 in the sputtering surface 21. Each Al target plate 18 was placed into a sputtering apparatus (not shown) and sputtered under a sputtering environment where the powers ranged from 8 W/cm$^2$ to 60 W/cm$^2$ at a 0.5 Pa argon pressure. The argon plasmas so generated were magnetically contained so that the targets operated in the DC magnetron-sputtering mode. The 10 kW switching sputtering power supply used in this study was an Advanced Energy model 2012-061-m MDX–10K. Target/substrate spacing was 143 mm. Sputtering power density was calculated by dividing the sputtering power by the area of the sputtering track 23, which was 12.7 cm$^2$ for each target.

Table 1 below provides the sputtering voltage, current, ion current density and the sheath thickness for the sputtering conditions used in this study.

| Power Density (W/cm$^2$) | V (Volts) | I (Amps) | $J_i$ (A/m$^2$) | s (mm) |
|---|---|---|---|---|
| 8 | 405 | 0.26 | 194 | 0.60 |
| 16 | 459 | 0.46 | 344 | 0.49 |
| 24 | 486 | 0.64 | 479 | 0.44 |
| 32 | 496 | 0.82 | 613 | 0.39 |
| 40 | 505 | 1.00 | 748 | 0.36 |
| 48 | 518 | 1.16 | 868 | 0.34 |
| 56 | 503 | 1.40 | 1047 | 0.30 |

The ion current density was calculated by assuming a secondary electron coefficient of 0.045. The sheath thickness in the sputter track was calculated using the Child-Langmuir Law. From Table 1, the sheath thickness for the experimental conditions used in this study decreases from 600 μm at low power conditions to 300 μm at high power conditions. Sheath thickness for 24 W/cm$^2$ sputtering power was 440 μm.

Figure 3:
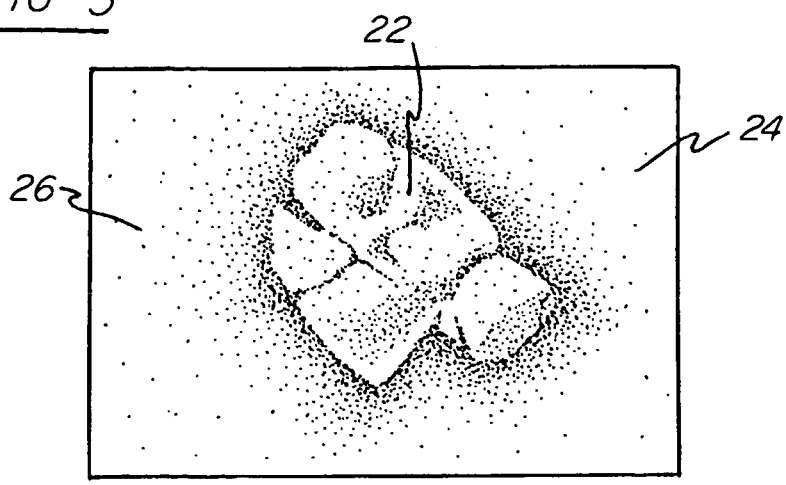
FIG. 3 is a partial top perspective view of an aluminum sputter target provided with an aluminum oxide inclusion.
Figure 4:
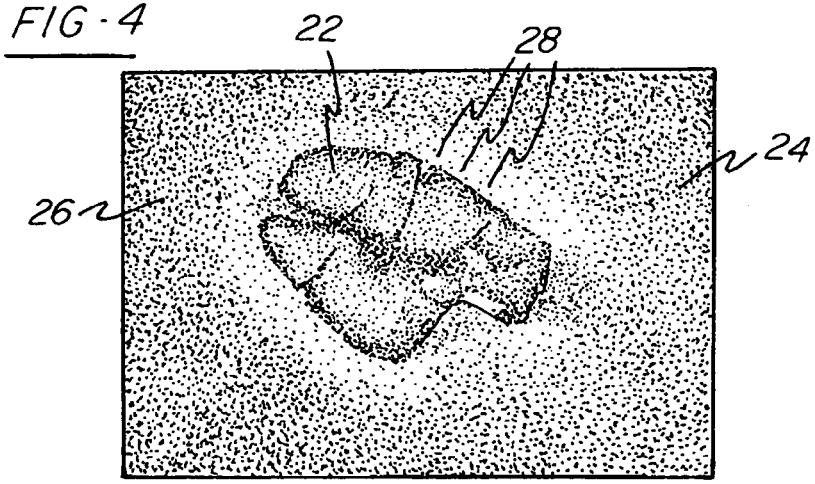
FIG. 4 is a view of FIG. 3 after sputtering of the sputter target.

FIGS. 3 and 4 show an enlarged ~3 mm size $Al_2O_3$ inclusion 22 embedded into the sputtering surface 24 of an aluminum target plate 26 before and after sputtering. As shown in FIG. 4, the inclusion 22 remains well attached to the sputtering surface 24 with little change in size or shape after sputtering. The sputtering process erodes the sputtering surface 24 so that some grain boundary structure 28 can be seen after sputtering as suggested in FIG. 4.

Polished 150 mm diameter silicon wafers were used as the substrates for these experiments. Deposited films were analyzed for particulate defects using a Tencor 6420 surface analyzer. Each wafer was analyzed after sputter coating for 1 minute. Particulate defects in the deposited film were grouped by apparent size with size bins ranging from 0.5 to 12 μm. The background particle density was measured by depositing aluminum films on wafers without an embedded inclusion. The background total particle density was 8.5 cm$^{-2}$.

The arc rate was measured by monitoring detected current pulses on the main power lead from the power supply to the sputtering cathode. A coil placed around the cathode power cable inductively detected the current pulses when arcs occurred. The voltage pulses induced in the sensing coil were recorded on an oscilloscope and a pulse counter. The arc rate was the total arc count divided by the deposition time.

II. Results

Figure 5:
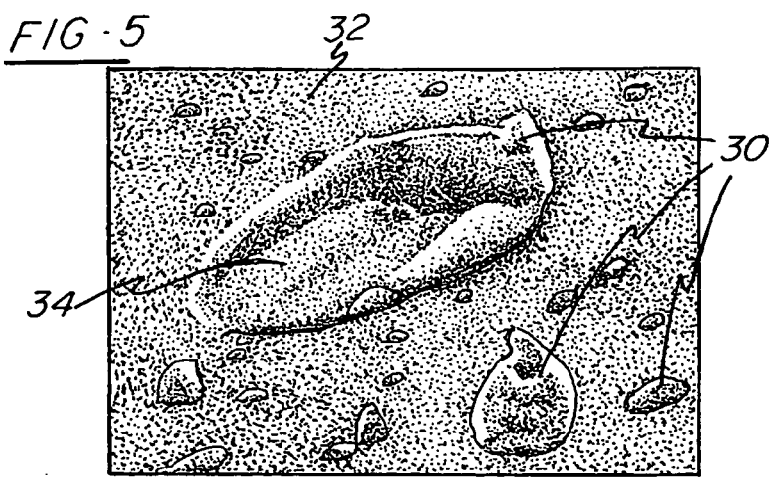
FIG. 5 is a partial top perspective view of an aluminum microparticle on a silicon wafer.

Molten macroparticle ejection during arcing of sputtering targets produces defects that have a particular morphology arising from their molten origin. FIG. 5 shows aluminum macroparticles 30 captured on a silicon wafer 32 during aluminum sputter deposition. The relative large volume of the large macroparticle 34 and the flattened shape shown in FIG. 5 are often seen in large macroparticles. Macroparticles 30 emitted during the early stages of an arc or emitted as a result of surface contamination tend to be smaller and more spherical in shape. The shapes of the macroparticles 30 after solidification depend upon the surface tension of the liquid and the diameter of the macroparticle droplets prior to freezing on the wafer 32.

Figure 6:
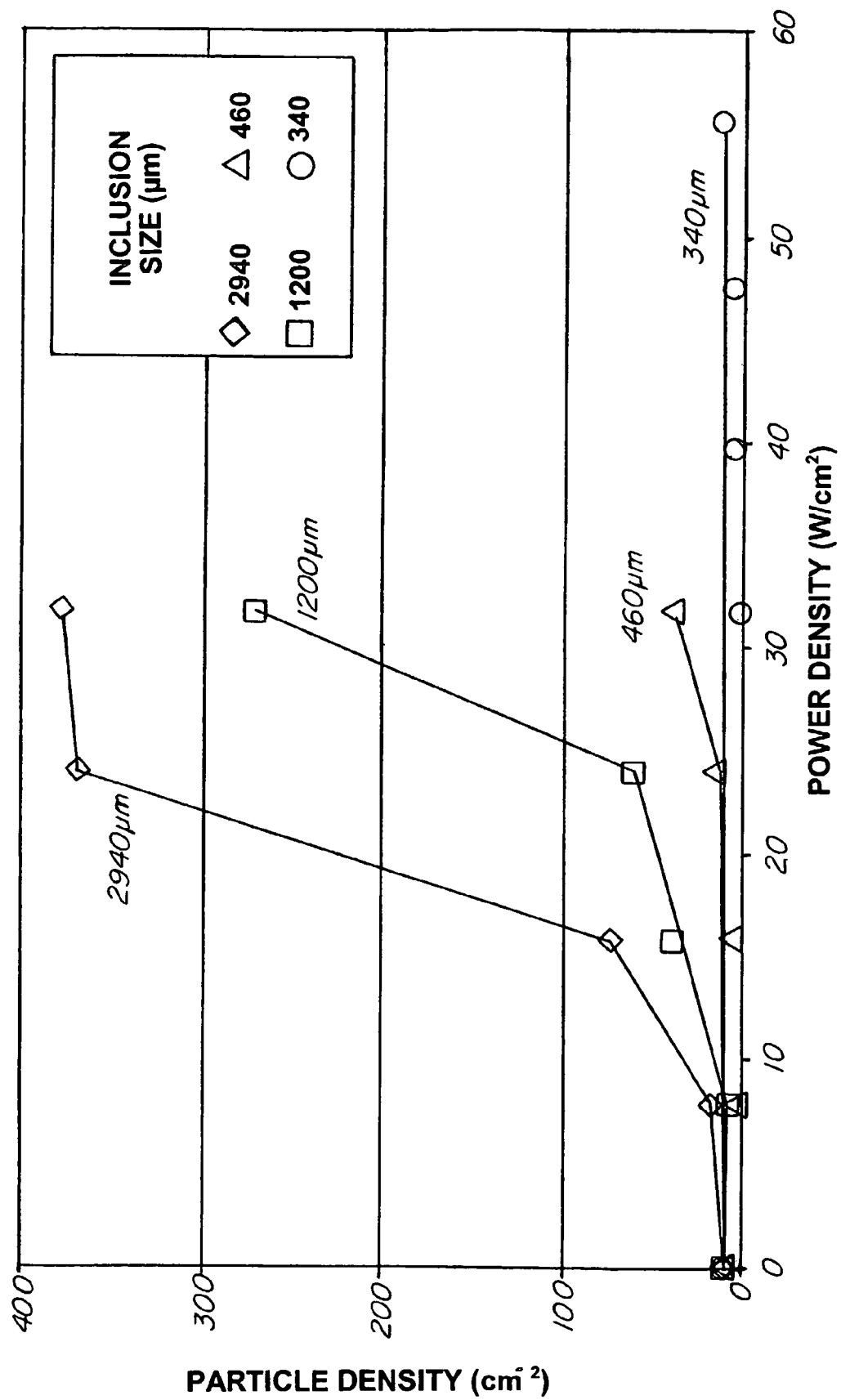
FIG. 6 is a graph representing the variation in total particle density found on silicon wafers with sputtering power density and inclusion size.

Measurements of the total macroparticle densities found on the wafers after sputtering for 1 minute with various size inclusions embedded into the faces of the target erosion tracks at various sputtering powers are provided in Table 2 below and graphically in FIG. 6.

| | Inclusion Size (μm) | | | | | | | | | | | |
|---|---|---|---|---|---|---|---|---|---|---|---|---|
| Power | 130 | | 340 | | 450 | | 460 | | 1200 | | 2940 | |
| Density (W/cm$^2$) | $R_a$ (sec$^{-1}$) | $P_d$ (cm$^{-2}$) | $R_a$ (sec$^{-1}$) | $P_d$ (cm$^{-2}$) | $R_a$ (sec$^{-1}$) | $P_d$ (cm$^{-2}$) | $R_a$ (sec$^{-1}$) | $P_d$ (cm$^{-2}$) | $R_a$ (sec$^{-1}$) | $P_d$ (cm$^{-2}$) | $R_a$ (sec$^{-1}$) | $P_d$ (cm$^{-2}$) |
| 8 | 0 | 3.9 | 0 | | 0 | 7.0 | 0 | 2.5 | 0 | 6.6 | 5 | 17 |
| 16 | 0 | 2.7 | 0 | | 0.2 | 3.8 | 0.9 | 3.4 | 0.6 | 38 | 433 | 72 |
| 24 | 0 | 3.0 | 0 | | 3.4 | 3.1 | 99 | 16 | 356 | 59 | 10718 | 368 |
| 32 | 1.6 | | 0 | 1.4 | 81 | 19 | 914 | 39 | 2456 | 269 | 8934 | 377 |
| 40 | | | 0 | 2.2 | | | | | | | | |
| 48 | | | 0 | 3.5 | | | | | | | | |
| 56 | | | 0 | 12 | | | | | | | | |

In Table 2 above, $R_a$ and $P_d$ represent the arc rate and the measured density of particles found on the wafer. At low sputtering power density, no macroparticles were detected above the background level. Inclusions with diameters of less than 340 μm did not cause ejection of measurable macroparticles even at power densities of over 50 W/cm$^2$. As the diameters of the inclusions increased from 340 μm, the total particle densities found on the wafers increased. Also, the sputtering power density required to generate particle defects on the wafers decreased to the point that for an inclusion having a diameter of 2940 μm, a significant increase in particle defect density on the wafer was found with a sputtering power density of only 16 W/cm$^2$.

So from this data, it can be concluded that there are two factors controlling the emission of macroparticles from a sputtering target: the sputtering plasma conditions and the size of dielectric inclusions. When the diameters of the dielectric inclusion falls below a critical value, arcing and macroparticle emission do not occur.

Figure 7:
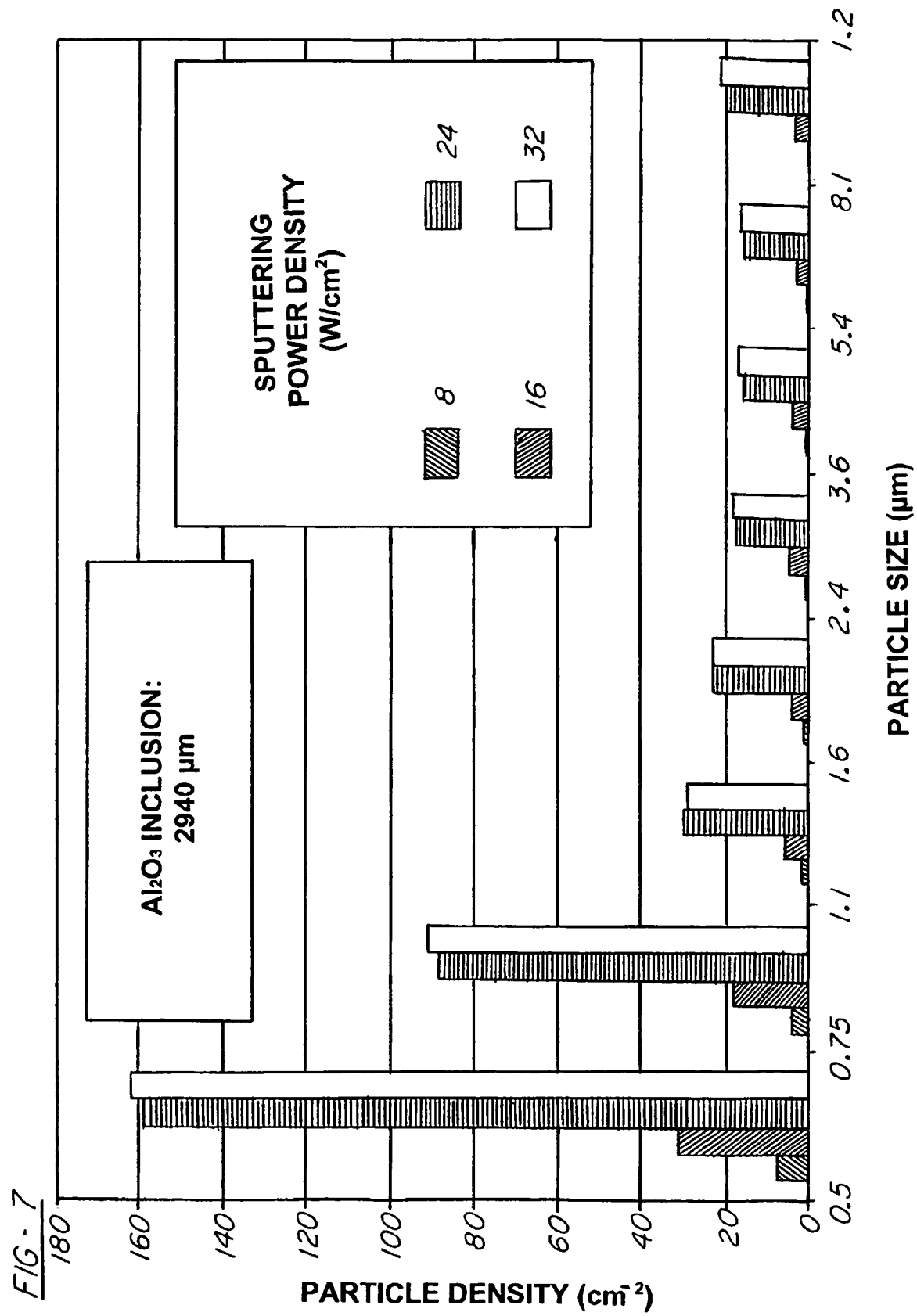
FIG. 7 is a graph representing the particle size distributions found on silicon wafers after sputtering at 8, 16, 24, and 32 W/cm² power densities with a 2940 µm inclusion in the target sputter track.

The size distributions of the macroparticle defects on the wafers after sputtering with 2940 μm inclusions in the target surfaces is provided in FIG. 7. From this data, as the sputtering power density increased, the number of particle defects on the wafer increased in all size categories. Also, the majority of the particle defects (>60%) were less than 1.1 μm in size. This type of macroparticle size distribution is consistent with measurements of macroparticle size distributions emitted by vacuum arc studies with clean metallic surfaces. During the arc, most of the particles emitted are small, fast-moving particles emitted at an angle of 30° from the plane of the cathode, but a small number of very large slow moving particles are emitted with trajectories near perpendicular to the cathode surface. These are the types of particles shown in FIG. 5 and represented in FIG. 7 in the large size end of the size distribution.

Figure 8:
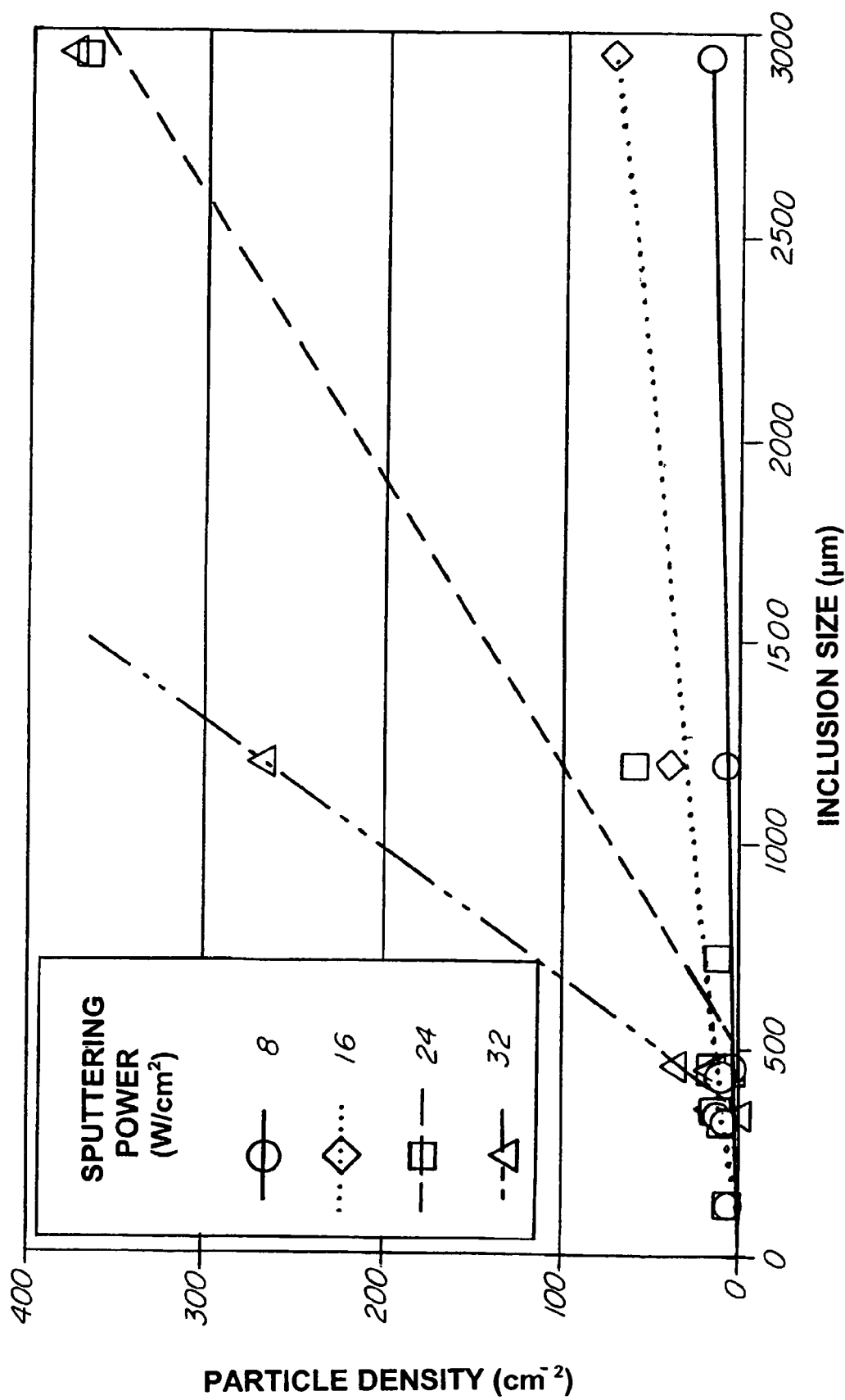
FIG. 8 is a graph representing the variation in total particle defect density on the wafer after sputtering with embedded inclusion size for sputtering power densities of 8, 16, 24 and 32 W/cm².

FIG. 8 shows how the total particle densities on the wafers varied with embedded inclusion size as the sputtering power density increased from 8 to 32 W/cm2. Below about 500 μm inclusion size, the defect particle density could not be distinguished above the background particle density on the wafer. The critical inclusion size for generation of macroparticles on the wafer above the background level was determined for each power density by doing a least-squares fit of the data for inclusion sizes greater than 340 μm. The lines in FIG. 8 show the least-squares fits of the data for the various power densities. It is clear that the slopes of the particle density versus inclusion size lines increases with sputtering power. However, the x-intercepts do not change significantly with sputtering power. All x-axis intercepts appear to be near the 500-μm-inclusion size.

Figure 9:
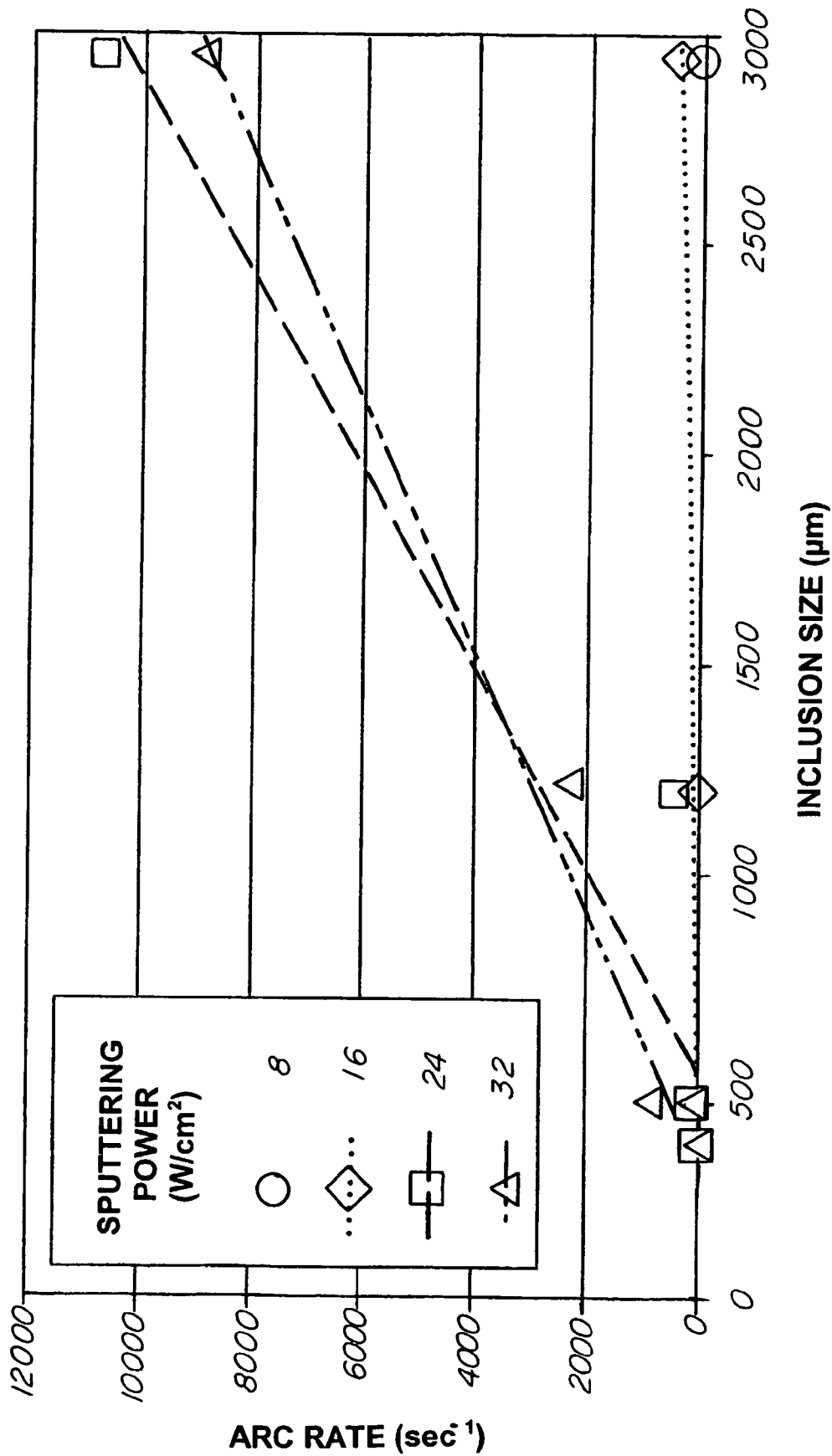
FIG. 9 is a graph representing the arc rate as a function of embedded $Al_2O_3$ inclusion size at 8, 16, 24 and 32 W/cm² sputtering power densities.

A similar result is obtained if we plot the arc rate as a function of inclusion size. This data is shown in FIG. 9. Again, as the power density increases the slope of the arc rate versus inclusion size curves increase while the x-intercept remains relatively constant. In the case of the curves at 24 and 32 W/cm$^2$, the slopes of both curves are equal within experimental error. This suggests that the arc rate may be reaching a saturation condition at 24 W/cm$^2$ so that increasing sputtering power density does not generate an increase in arc rate at these high power densities.

Figure 10:
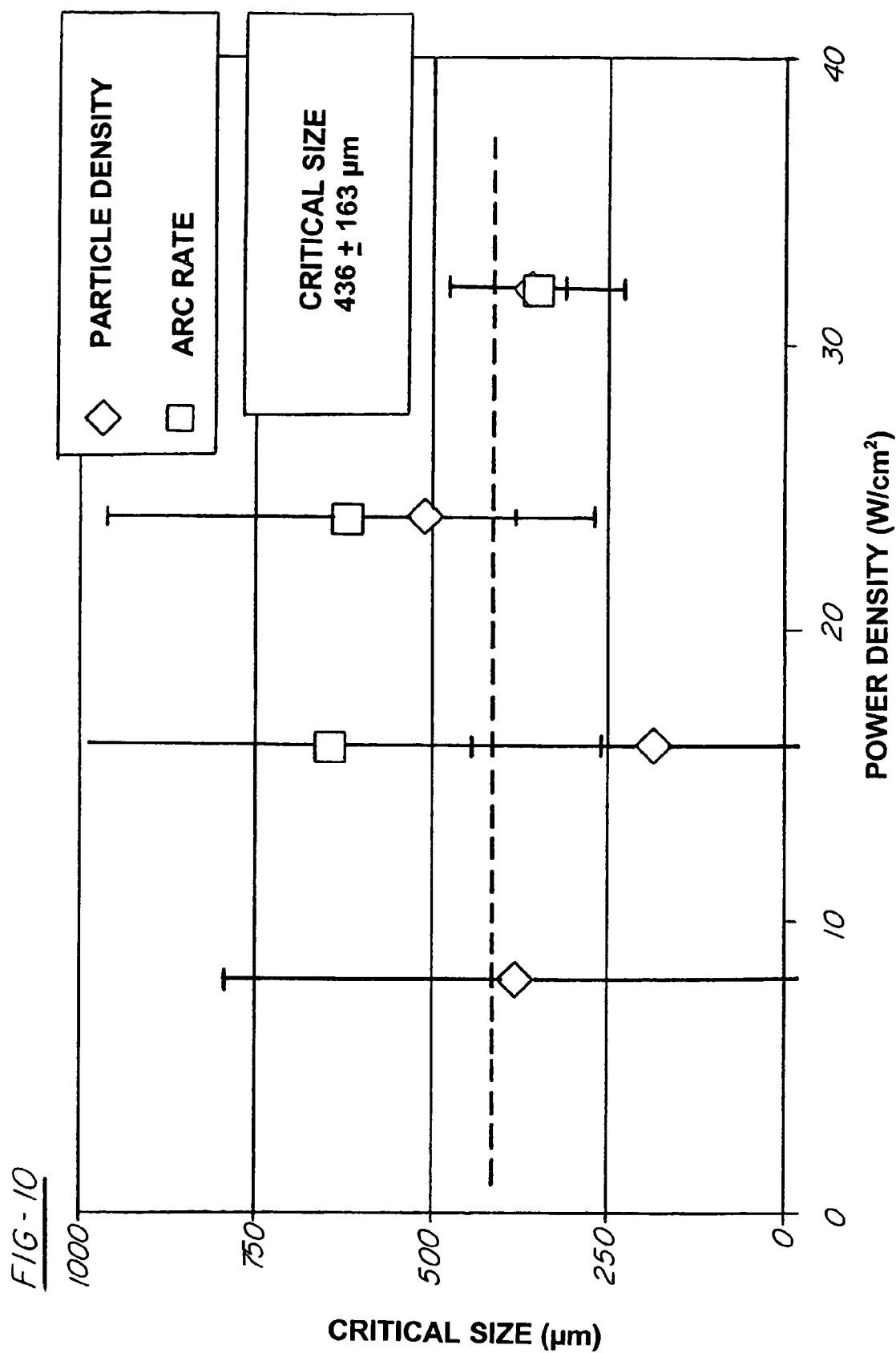
FIG. 10 is a graph representing the variation in inclusion critical size with sputtering power density for particle density and arc rate measurements.

The critical inclusion size for initiation of arcing and molten macroparticles ejection for each data set is graphed in FIG. 10 as a function of the sputtering power density. The error bars are derived from the error of estimate obtained from the least-squares-fits in FIGS. 8 and 9. The data in FIG. 10 gives an average value for the critical inclusion size of 440±160 μm. It can also be seen in FIG. 10 that the crucial inclusion size is within experimental error independent of the sputtering power density. The critical size is 440±160 μm for the conditions used in this study wherein the plasma sheath thickness ranged from 300 to 600 μm.

These single inclusion experiments were repeated using a commercial sputtering source used for aluminum alloy deposition on 200-mm diameter silicon wafers. This sputtering source used a rotating magnet for plasma confinement and improved film uniformity and target utilization. Inclusions with sizes of 450 and 730 μm were embedded into the aluminum sputtering target surface and the target was sputtered at 10.6 kW power with 0.5 Pa argon pressure. Measurements of the arc rate and particle defect density on 200 mm silicon wafers after sputtering for 1 minute showed results consistent with the data reported herein for the 7.6 cm diameter target. The arc rate was 2.5 sec$^{-1}$ with the 450-μm inclusion increasing to 52 sec$^{-1}$ when the 730-μm inclusion was embedded. Similarly, the total particle defect density detected on the silicon wafer was 3 cm$^{-2}$ when the 450-μm inclusion was used increasing to 11 cm$^{-2}$ for the 730 μm inclusion. These values fit the data in FIGS. 9 and 10 for power density of 24 W/cm$^2$.

III. Discussion

Figure 11:
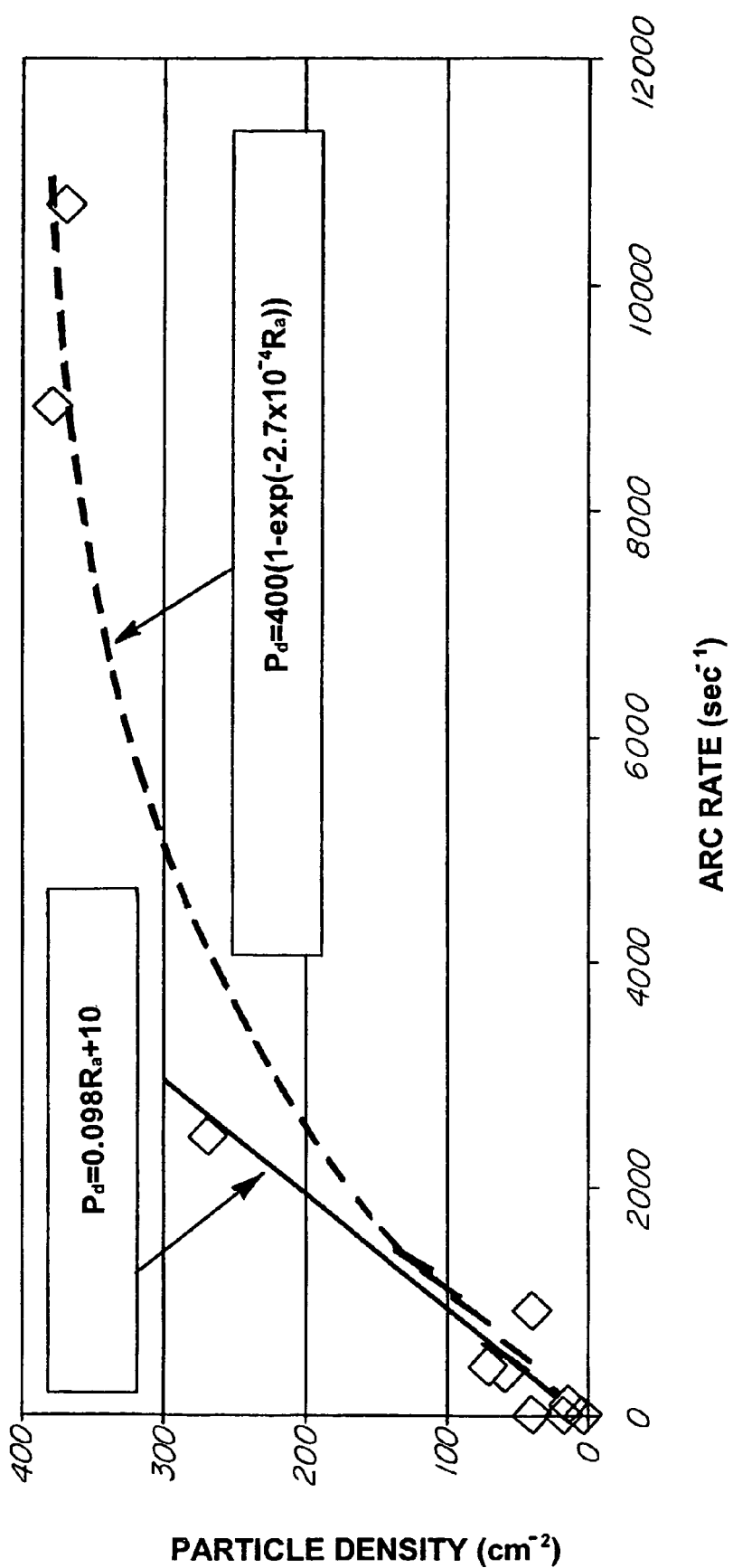
FIG. 11 is a graph representing the correlation between arc rate and total particle defect density found on the wafer.

In light of the above, the critical inclusion size appears to be related to the conditions for initiating the arc and not related to conditions to form molten metal on the target surface or to break the molten metal surface tension for ejection of molten macroparticles from the cathode surface. It has already been shown that the force exerted by an arc on the cathode surface is more than sufficient to overcome the surface tension and eject molten macroparticles. So, once an arc occurs macroparticle ejection is likely. This is confirmed by comparing our measurements of particle defect density on the wafer with arc rate. The arc rate and the total particle defect density are clearly related to each other. FIG. 11 shows the relationship between total particle defect density found on the wafer, $P_d$, and the arc rate, $R_a$, during film deposition. For the target-substrate geometry used in this study, at arc rates below about 2500 sec$^{-1}$ one particle is detected on the wafer for every ten arc events.

Figure 12:
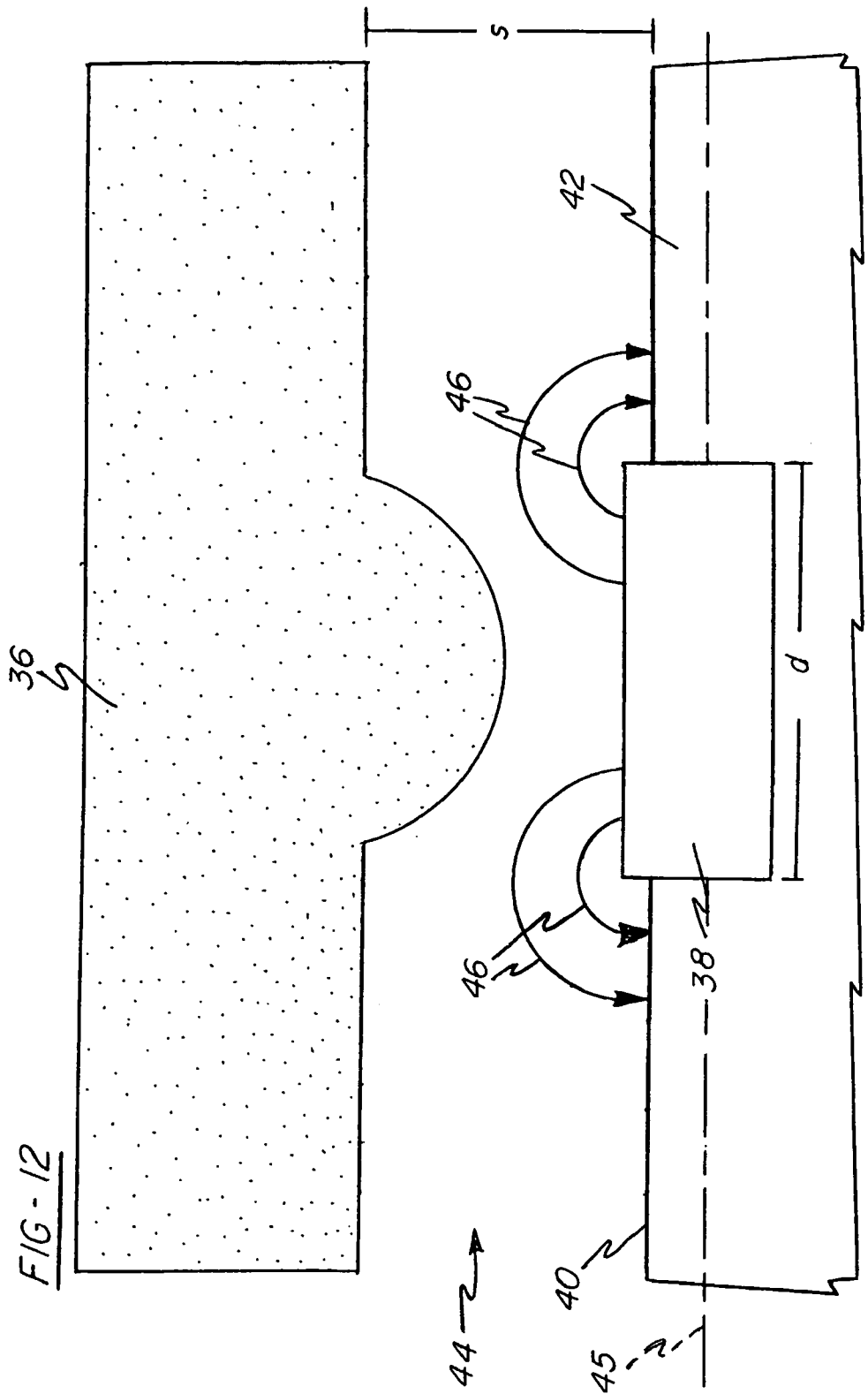
FIG. 12 is a schematic diagram of the distortion of the plasma in a sputtering apparatus by inclusion charging caused by an $Al_2O_3$ inclusion located on the surface of a sputter target.

Without wishing to be bound to any theory of operation, arc formation and ejection of the molten metal macroparticles appears to be based upon the interaction of the dielectric surface of the inclusion with the sputtering plasma. FIG. 12 shows a schematic representation of the plasma 36 when an $Al_2O_3$ inclusion 38 is present on the cathode sputtering surface 40 of a target plate 42 such that the diameter (d) of the $Al_2O_3$ inclusion 38 is greater than the thickness (s) of the plasma sheath 44 that is located over an area of the target plate 42 free from $Al_2O_3$ inclusions. Notably, the plasma sheath 44 separates the positive column of the plasma 36 and the cathode sputtering surface 40. Introduction of the inclusion 38 on the sputtering surface 40 of the target plate 42 leads to distortion of the plasma 36 and the sheath 44. Since sputtering of the target plate 42 is performed at the sputtering surface 40, it is preferred that the measurement of the diameter (d) of the $Al_2O_3$ inclusion 38 be taken along a plane 45 substantially parallel with the sputtering surface 40.

Detailed examination of the process that leads to sheath disruption and the formation of the arc, as represented by arrows 46 in FIG. 12, begins with the charging of the dielectric surface layer from ion bombardment during the sputtering process. This charge distorts the electric field in the dark space about the dielectric region. The severity of this electric field distortion depends on the relationship between diameter (d) of the dielectric inclusion and the sheath thickness (s). For small diameter inclusions, when the inclusion exposed to the plasma is significantly less than the sheath thickness, the disruption to the electric field in the dark space is concentrated in the vicinity of the inclusion. In fact, when the dielectric inclusion size exposed to the plasma is much less than the plasma sheath thickness (s0, the disturbance of the plasma sheath above and away from the inclusion surface is negligible.

As the inclusion 38 exposed to the plasma 36 approaches a diameter (d) that is equal to or greater than the sheath thickness (s), the charge on the inclusion 38 acts to almost neutralize the electric field in the original sheath region above the inclusion 38. This causes the plasma boundary to sag toward the inclusion 38 and the plasma sheath thickness over the inclusion 38 decreases as the plasma positive column diffuses into the volume over the charged inclusion 38. As the plasma column diffuses inward and the field barrier separating the plasma 36 from the cathode shrinks, a plasma channel forms over the inclusion. This plasma channel grows primarily by radial diffusion of the plasma 36.

Since one cannot expect the inclusion to be perfectly symmetrical, the electric field distribution around the inclusion also will not be symmetrical. Since the electric field distortion will tend to mimic the inclusion asymmetry, the radial growth of the plasma channel will also be asymmetrical. As the plasma channel grows, a point is reached where conditions permit breakdown and an arc strikes between a site on the cathode surface near the inclusion and the plasma channel. When the arc occurs, the energy stored in the power supply (not shown) and the connecting cable (not shown) is discharged as an arc. This arc, once formed, is free to move across the cathode surface 40 creating arc tracks and ejecting molten macroparticles.

As described above, the arc spot with this model will tend to occur on the metallic cathode surface 40 near the inclusion 38. This is consistent with observations that the arc tracks do not intersect the inclusions 38, but are near the inclusion 38.

If this model is correct, then we would expect that when the aspect ratio of the inclusion 38 deviates from one, the smaller dimension of the inclusion 38 will control the field distribution distortion over the inclusion 38 and therefore will control the degree of sheath distortion and the propensity for arcing. So, from our model, the aspect ratio of the inclusion 38 will be an important variable. This model predicts that the arc rate will also be relatively insensitive to the area of the inclusion 38. For example, a very narrow inclusion with large area will arc at the same rate as an inclusion with an aspect ratio of 1 and dimension equal to the narrow dimension of the much larger area narrow inclusion.

Also, the arc rate will depend on location of the inclusion with respect to the local current density and sheath thickness. That is, if the sputtering surface 40 corresponds to an imaginary surface (not shown) within the sputtering apparatus, the arc rate and, thus, the local critical diameter, will depend on location along that imaginary surface. Since for typical fixed magnet planar magnetron sputtering systems the current density over the surface of the target is highly non-uniform, the sheath thickness will also be non-uniform depending upon the local current density. From the Child-Langmuir law the sheath thickness in, for example, the sputter track area of a typical sputtering condition with 50 mA/cm$^2$ current density will be 0.4 mm. However, moving away from the sputter track to the areas where current densities decrease to 10 mA/cm$^2$ will increase the sheath thickness to 0.9 mm. Therefore, the critical inclusion size for arcing in fixed magnet systems depends on the location of the inclusion 38 on the target surface 40. The critical inclusion size decreases in the sputter track areas (high power density and smaller sheath thickness) and increases in non-sputter track areas (low power density and larger sheath thickness). Lastly, when a thin inclusion is present on the sputtering target surface, arcing can still result indicating that the thickness aspect of the inclusion does not appear to play a significant role in the process.

While the methods herein described constitute preferred embodiments of this invention, it is to be understood that the invention is not limited to these precise methods and that changes may be made without departing from the scope of the invention, which is defined in the appended claims.

The invention claimed is:

1. A method for selecting one or more Al or Al alloy sputtering targets for use in a sputtering apparatus comprising:
   a) determining a plasma sheath thickness in said sputtering apparatus;
   b) determining diameters of $Al_2O_3$ surface inclusions along a surface of each target of a plurality of Al or Al alloy sputtering targets; and
   c) selecting only those sputtering targets of the plurality of Al or Al alloy sputtering targets having such diameters of $Al_2O_3$ surface inclusions less than said plasma sheath thickness.

2. The method as recited in claim 1 wherein said step a) includes sputtering an Al or Al alloy sputtering target substantially free of $Al_2O_3$ inclusions in said sputtering apparatus in a gas defining an ion mass at a sputtering voltage; determining said ion mass; determining said sputtering voltage; determining an ion current density at a surface of said Al or Al alloy sputtering target; and estimating said plasma sheath thickness using said ion mass, said sputtering voltage, and said ion current density.

3. The method as recited in claim 1 wherein said step a) includes sputtering an Al or Al alloy sputter target substantially free of $Al_2O_3$ inclusions in said sputtering apparatus in a gas defining an ion mass $M_i$ at a sputtering voltage V; determining said ion mass $M_i$; determining said sputtering voltage V; determining an ion current density $J_i$ at a surface of said Al or Al alloy sputtering target; and estimating said plasma sheath thickness s using the equation $s=4.7\times10^{-11} V^{3/4}/(M_i \cdot J_i)^{1/4}$.

4. The method as recited in claim 1 wherein said plasma sheath thickness is between about 300 µm and 600 µm.

5. The method as recited in claim 1 wherein said sputtering apparatus is capable of sputtering in an argon atmosphere at a sputtering power of between about 8 W/cm² and 60 W/cm².

6. A method to inhibit arcing in an Al or Al alloy sputter target having an $Al_2O_3$ inclusion comprising:
   a) providing a sputtering apparatus having a plasma with a plasma sheath of a known thickness during sputtering, under a selected sputtering environment, of an Al or Al alloy sputter target having an $Al_2O_3$ inclusion-free sputtering surface;
   b) providing an Al or Al alloy sputter target having one or more $Al_2O_3$ inclusions and a sputtering surface for sputtering in said sputtering apparatus under said selected sputtering environment wherein said one or more $Al_2O_3$ inclusions include a diameter less than said known thickness of said plasma sheath; and
   c) sputtering in said sputtering apparatus under said selected sputtering environment said Al or Al alloy sputter target having said one or more $Al_2O_3$ inclusions whereby arcing is inhibited.

7. A method to inhibit arcing in an Al or Al alloy sputter target having an $Al_2O_3$ inclusion as recited in claim 6 wherein said plasma is argon.

8. A method to inhibit arcing in an Al or Al alloy sputter target having an $Al_2O_3$ inclusion as recited in claim 6 wherein said diameter of said one or more $Al_2O_3$ inclusions is situated in a plane substantially parallel with said sputtering surface of said Al or Al alloy sputter target having said one or more $Al_2O_3$ inclusions.

9. A method to inhibit arcing in an Al or Al alloy sputter target having an $Al_2O_3$ inclusion as recited in claim 6 wherein said one or more $Al_2O_3$ inclusions have an aspect ratio of about 1.

10. A method to inhibit arcing in an Al or Al alloy sputter target as recited in claim 6 wherein said Al or Al alloy sputter target having said $Al_2O_3$ inclusion-free sputtering surface and said Al or Al alloy sputter target with said one or more $Al_2O_3$ inclusions are free from surface contamination.

11. A method for determining a critical size for an $Al_2O_3$ inclusion in an Al or Al alloy sputter target as recited in claim 6 wherein said measured thickness of said plasma sheath is between 300 µm and 600 µm.

12. A method for determining a critical size for an $Al_2O_3$ inclusion in an Al or Al alloy sputter target as recited in claim 6 wherein said sputtering environment includes a 0.5 Pa argon pressure and a sputtering power from 8 W/cm² to 60 W/cm².

13. A method to inhibit arcing in an Al or Al alloy sputter target having an $Al_2O_3$ inclusion as recited in step b) of claim 6 wherein said Al or Al alloy sputter target is similar in shape and size to said Al or Al alloy sputter target having said $Al_2O_3$ inclusion-free sputtering surface.

14. A method to inhibit arcing in an Al or Al alloy sputter target having an $Al_2O_3$ inclusion comprising:
   a) providing an Al or Al alloy sputter target having an $Al_2O_3$ inclusion-free sputtering surface;
   b) providing a sputtering apparatus for sputtering in a plasma said Al or Al alloy sputter having said $Al_2O_3$ inclusion-free sputtering surface, said plasma including a plasma sheath having a certain thickness during sputtering of said $Al_2O_3$ inclusion-free sputtering surface under a selected sputtering environment;
   c) measuring said thickness of said plasma sheath under said selected sputtering environment;
   d) providing one or more of an Al or Al alloy sputter target having one or more $Al_2O_3$ inclusions and a sputtering surface for sputtering in said sputtering apparatus under said selected sputtering environment, said one or more $Al_2O_3$ inclusions including a diameter;
   e) measuring said diameter of said one or more $Al_2O_3$ inclusions;
   f) comparing said measured diameter with said measured thickness of said plasma sheath; and
   g) sputtering in said sputtering apparatus under said selected sputtering environment at least one of said one or more of said Al or Al alloy sputter target wherein said measured diameter of said one or more $Al_2O_3$ inclusions is less than said measured thickness of said plasma sheath so that arcing is inhibited.

15. A method to inhibit arcing in an Al or Al alloy sputter target having an $Al_2O_3$ inclusion as recited in claim 14 further including between steps f) and g) placing each of said one or more of said Al or Al alloy sputter target into a class of accepted and rejected sputter targets, said class of accepted sputter targets including said each of said one or more of said Al or Al alloy sputter target having said one or more $Al_2O_3$ inclusions with said measured diameter being less than said measured thickness of said plasma sheath.

16. A method to inhibit arcing in an Al or Al alloy sputter target having an $Al_2O_3$ inclusion as recited in claim 15 further including after placing said each of said one or more of said Al or Al alloy sputter target into said class of accepted and rejected sputter targets, rejecting each said Al or Al sputter target in said class of rejected sputter targets.

17. A method to inhibit arcing in an Al or Al alloy sputter target as recited in claim 14 wherein said Al or Al alloy sputter target having said $Al_2O_3$ inclusion-free sputtering surface and said one or more of said Al or Al alloy sputter target are free from surface contamination.

18. A method to inhibit arcing in an Al or Al alloy sputter target as recited in claim 14 wherein said diameter of said one or more $Al_2O_3$ inclusions is situated in a plane substantially parallel with said sputtering surface of said Al or Al alloy sputter target.

19. A method to inhibit arcing in an Al or Al alloy sputter target having an $Al_2O_3$ inclusion as recited in claim 14 wherein measuring said thickness of said plasma sheath in said step c) includes applying a Child-Langmuir law.

20. A method to inhibit arcing in an Al or Al alloy sputter target having an $Al_2O_3$ inclusion as recited in claim 14 wherein said measured thickness of said plasma sheath is between 300 µm and 600 µm.

21. A method to inhibit arcing in an Al or Al alloy sputter target having an $Al_2O_3$ inclusion as recited in claim 14 wherein said sputtering environment includes a 0.5 Pa argon pressure and a sputtering power from 8 W/cm² to 60 W/cm².

22. A method to inhibit arcing in an Al or Al alloy sputter target having an $Al_2O_3$ inclusion as recited in step d) of claim 14 wherein each of said one or more of said Al or Al alloy sputter target is similar in shape and size to said Al or Al alloy sputter target having said $Al_2O_3$ inclusion-free sputtering surface.

* * * * *